United States Patent
Bagung et al.

(10) Patent No.: US 8,294,031 B2
(45) Date of Patent: Oct. 23, 2012

(54) SOLDER RESIST COATING FOR RIGID-FLEX CIRCUIT BOARDS AND METHOD OF PRODUCING THE SOLDER RESIST COATING

(75) Inventors: Detlev Bagung, Bernhardswald (DE); Michael Decker, Regensburg (DE); Gregory Drew, Regensburg (DE); Thomas Riepl, Bad Abbach (DE); Bernd Roller, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 200 days.

(21) Appl. No.: 12/697,407

(22) Filed: Feb. 1, 2010

(65) Prior Publication Data

US 2010/0193223 A1   Aug. 5, 2010

(30) Foreign Application Priority Data

Jan. 30, 2009  (DE) .......................... 10 2009 006 757

(51) Int. Cl.
H05K 1/00 (2006.01)

(52) U.S. Cl. ........ 174/254; 174/256; 174/257; 174/262; 257/777; 257/778; 257/783; 29/829; 29/830; 29/831; 29/840; 228/175

(58) Field of Classification Search ................... 174/254, 174/256, 257, 262; 257/777, 778, 783; 29/829, 29/830, 831, 840; 228/175
See application file for complete search history.

(56) References Cited

U.S. PATENT DOCUMENTS

| | | | |
|---|---|---|---|
| 5,206,463 A | 4/1993 | DeMaso et al. | |
| 5,777,386 A * | 7/1998 | Higashi et al. | 257/737 |
| 6,350,387 B2 | 2/2002 | Caron et al. | |
| 6,483,037 B1 * | 11/2002 | Moore et al. | 174/254 |
| 6,527,162 B2 * | 3/2003 | Totani et al. | 228/175 |
| 6,734,535 B1 * | 5/2004 | Hashimoto | 257/668 |
| 7,105,931 B2 * | 9/2006 | Attarwala | 257/783 |
| 2002/0135727 A1 * | 9/2002 | Nakaminami et al. | 349/149 |
| 2003/0079341 A1 * | 5/2003 | Miyake et al. | 29/830 |
| 2003/0207499 A1 * | 11/2003 | DiStefano et al. | 438/125 |
| 2005/0161776 A1 * | 7/2005 | Naitoh | 257/666 |
| 2005/0190531 A1 * | 9/2005 | Gall et al. | 361/600 |
| 2006/0180344 A1 * | 8/2006 | Ito et al. | 174/262 |
| 2007/0242207 A1 * | 10/2007 | Fujita | 349/149 |
| 2008/0093110 A1 | 4/2008 | Bagung | |
| 2008/0107802 A1 * | 5/2008 | Kawaguchi et al. | 427/97.2 |
| 2008/0179079 A1 | 7/2008 | Ishii et al. | |
| 2008/0285910 A1 * | 11/2008 | Yamada et al. | 385/14 |
| 2008/0289859 A1 * | 11/2008 | Mikado et al. | 174/254 |
| 2009/0028497 A1 * | 1/2009 | Kodama et al. | 385/14 |
| 2010/0025844 A1 * | 2/2010 | Yamazaki | 257/693 |

FOREIGN PATENT DOCUMENTS

| | | |
|---|---|---|
| DE | 4405228 C1 | 7/1995 |
| DE | 19716044 A1 | 10/1998 |
| DE | 20320760 U1 | 3/2005 |
| DE | 102005012404 A1 | 9/2006 |
| EP | 1575344 A1 | 9/2005 |

OTHER PUBLICATIONS

German Office Action dated Aug. 28, 2009.
* cited by examiner

*Primary Examiner* — Xiaoliang Chen
(74) *Attorney, Agent, or Firm* — Laurence A. Greenberg; Werner H. Stemer; Ralph E. Locher

(57) ABSTRACT

A solder resist coating for a rigid-flex circuit board contains one or more conductor tracks and at least one flex area. The solder resist coating has one or more movement gaps in the flex area of the circuit board. In addition, an electronic module is formed having at least one rigid-flex circuit board with a solder resist coating.

10 Claims, 3 Drawing Sheets

SOLDER RESIST COATING FOR RIGID-FLEX CIRCUIT BOARDS AND METHOD OF PRODUCING THE SOLDER RESIST COATING

CROSS-REFERENCE TO RELATED APPLICATION

This application claims the priority, under 35 U.S.C. §119, of German application DE 10 2009 006 757.4, filed Jan. 30, 2009; the prior application is herewith incorporated by reference in its entirety.

BACKGROUND OF THE INVENTION

Field of the Invention

The invention relates to a solder resist coating for circuit boards having rigid and flexible sub-areas.

A circuit board often has to be adapted in respect of its shape and arrangement to suit design circumstances and external constraints. In automotive engineering, for example, aspects such as safety, cost savings, weight savings and esthetics may take precedence over the mounting dimensions and shape of the circuit boards.

For this purpose, circuit boards with printed circuits having rigid and flexible sub-areas for closed and open loop electronic control have been used for many years in devices or vehicles. The flexible sub-areas enable the degrees of freedom in the possible three-dimensional configuration of the circuit board to be increased. In more recent times, circuits have been fabricated using mainly rigid circuit board material for reasons of cost, the circuit board material having a lower thickness in the flexible areas than in the rigid areas. Such rigid-flex circuit boards and their fabrication are described, for example, in German patents DE 44 05 228 C1 and DE 10 2005 012 404 B4, corresponding to U.S. patent publication No. 2008/0093110 A. A motor vehicle control unit having a rigid-flex circuit board is also described in European patent EP 1 575 344 B1.

On their surface, circuit boards usually have pads onto which components can be mounted using solder. The solder required for this purpose must be provided for these surface mount components in the form of deposits. As described in published, non-prosecuted German patent application DE 197 16 044 A1, the conductor tracks of the circuit boards are protected during this process by a solder resist coating which extends over the entire surface area of the board with the exception of the areas of the solder deposits. The solder resist coating at the same time provides insulation protection.

As a result of flexure of the circuit board and the associated mechanical stress loading, undefined and uncontrolled peeling of the solder resist coating can occur, as the latter cannot, or can only inadequately, absorb the stresses. In order to avoid particulate contamination, short-circuits and early failures possibly resulting therefrom, these critical locations particularly subject to mechanical flexural stress must be taken into account.

To enable a flexible or semi-flexible printed circuit to withstand flexural stress without damage, it is proposed in German utility model DE 203 20 760 U1 to use, over the entire surface of the conductive foil layers of the circuit boards, a flexible solder resist which is flexible enough to enable the stresses introduced by flexure of the circuit board to be absorbed. Flexible solder resist masks as cover layers for rigid-flex circuit boards are also described in U.S. Pat. No. 6,350,387 B2. However, such flexible solder resists are very expensive so that, for reasons of cost, their use on the complete circuit board is not preferred. On the other hand, using the flexible solder resist only in the bent i.e. flexible area of the circuit boards while using conventional solder resist in the less mechanically stressed and/or rigid areas, results in a considerable additional manufacturing cost, as one or more additional process steps are necessary for applying different solder resists. This is in turn time-consuming and likewise cost-intensive.

SUMMARY OF THE INVENTION

It is accordingly an object of the invention to provide a solder resist coating for rigid-flex circuit boards and method for producing the solder resist coating which overcome the above-mentioned disadvantages of the prior art methods and devices of this general type, wherein the stresses in the solder resist coating in the event of flexure can be reduced and, in addition, the protection against short circuits and sparking caused by electrostatic discharges is maintained. The solder resist coating shall at the same time be simple and inexpensive to manufacture.

With the foregoing and other objects in view there is provided, in accordance with the invention a solder resist coating for a rigid-flex circuit board having at least one conductor track and at least one flex area. The solder resist coating contains a solder resist layer having at least one movement gap formed therein in an area of the flex area of the rigid-flex circuit board.

It is proposed according to the invention to provide a solder resist coating for a rigid-flex circuit board having one or more conductor tracks and at least one flex area. The solder resist coating has one or more movement gaps at least in the flex area of the circuit board.

In other words according to the invention, in addition to the openings in the solder resist coating which serve to define the solder lands on the circuit board, the so-called solder deposits or pads, further openings are provided in the solder resist coating which are used to reduce the stresses in the solder resist coating of the circuit board under flexural loading. Movement gaps according to the invention are understood as meaning narrow interstices in the solder resist coating that are solder resist free.

According to the invention, rigid-flex circuit boards are understood as having at least one rigid area and a flexible area connected thereto. According to the invention, the flexible area is also termed the flex area and can consist, for example, of per se rigid circuit board material of lesser thickness. For example, the flexible areas can then be formed by machining. This machining can be performed in a simple and precise manner, for example, by depth milling of the circuit board.

Within the scope of the invention, the flex area of the circuit board is understood as meaning the flexible area of the circuit board can undergo deformation due to a bending process. The flex area can be bent by a particular angular amount with respect to the plane of the rigid area of the circuit board, i.e. flexibly implemented. However, it is also possible according to the invention to implement the flex area or areas by polyimide foils, for example.

With the solder resist coating according to the invention it is advantageously possible to prevent undefined and uncontrolled peeling of the solder resist coating to a maximum extent or even completely, thereby reducing premature failures or short circuits as well as particulate contamination.

According to the invention, the dimensions and shape of the movement gaps of the particular solder resist coating can be selected depending on the use and the degree of desired flexure such that, on the one hand, peeling of the solder resist is prevented to a maximum extent and, on the other, the short circuit risk is minimized.

For this purpose it is additionally possible to vary the number of movement gaps provided, their arrangement on the circuit board, particularly in the flex area, and the spacings and arrangement of the movement gaps with respect to one another.

In a preferred embodiment of the solder resist coating according to the invention, the movement gaps can be linear in form, thereby enabling the movement gaps to be made particularly narrow and therefore reducing the risk of short circuits. Moreover, the movement gaps are easy to manufacture in this manner, it being inventively preferred that the movement gaps are straight-line-shaped. However, it is also possible in respect of the stress loading applied in the flex area that a regular or irregular wavelike pattern of the linear movement gaps will be advantageous.

If a plurality of movement gaps are provided, these can also be parallel and/or at regular distances from one another, but an irregular arrangement with respect to one another is also possible. By these possible variations, it is also advantageously possible to adapt to differential loading of different regions within the flex area.

In a further preferred embodiment, the movement gaps can here be implemented transversely to the bending direction of the circuit board. In this orientation, the movement gaps are particularly well able to compensate flexural stresses, such as stretching or compression. In this way, peeling of the solder resist coating on the circuit board can be prevented for longer or even completely. An improvement and extension of the service life of a circuit board can be inventively achieved both under continuous flexural stress and in cases in which the circuit board is subjected to a large number of bending processes.

With particular preference, it is provided according to the invention that the movement gaps are arranged perpendicular to the bending direction, i.e. at least approximately at an angle of 90° to the bending direction. The compensation of flexural stresses can be improved still further with such an orientation of the movement gaps.

In another preferred embodiment of the solder resist coating according to the invention, the movement gaps can extend over the entire width of the flex area of the circuit board, thereby enabling the solder resist coating also to be optimized for flexural stress loading over the entire width of the flex area. It is also possible here for the flex area to extend from an outer edge of the circuit board to the opposite outer edge.

A further preferred embodiment of the invention provides that, in addition to the transverse gaps, i.e. the movement gaps running crosswise to the bending direction, the solder resist coating has movement gaps oriented in the bending direction. The latter are also termed longitudinal gaps according to the invention. In a particularly preferred manner, the transverse and longitudinal gaps can be disposed such that solder resist blocks are produced in the flex area of the circuit board. In other words, the longitudinal gaps can intersect and/or break the transverse gaps, thereby enabling, for example, a grid-like or network-like pattern to be produced in the solder resist coating by the arrangement of the longitudinal and transverse gaps. The solder resist coating according to the invention can in this way be divided into smaller solder resist areas in the flex area. These mutually separate solder resist areas are termed solder resist coating blocks or solder resist blocks according to the invention. According to the invention, these solder resist blocks can be of the same or different size and/or shape. Large-scale and undefined peeling of the solder resist coating can thus be advantageously prevented, as the movement gaps can on the one hand reduce the stresses applied to the solder resist coating from the outset. In addition, the movement gaps delimit smaller coating areas, the solder resist blocks, and separate these from one another, thereby advantageously preventing, for example, stress peaks only in one solder resist block from being transferred into adjacent and/or other solder resist coating areas by the flexure.

Expediently, the solder resist blocks can preferably be disposed according to the invention on the conductor tracks, it being further preferred that the solder resist blocks are also made wider than the conductor tracks. This enables the short circuit risk to be further reduced.

In another preferred embodiment of the invention, the conductor tracks can be disposed such that they run in the bending direction. Therefore conductor track areas without solder resist coating are produced only in the transverse gaps.

According to the invention, the solder resist blocks can preferably be disposed offset to one another. Here the solder resist block can with particular preference be disposed such that the distance between the mutually nearest transverse gaps of two adjacent conductor tracks is greater than the distance of these two conductor tracks from one another. The advantage of this solution is that the distance between the unprotected conductor track areas in the transverse gaps is maximized. In other words, this enables the short circuit risk to be further reduced.

The solder resist coating according to the invention can be advantageously manufactured with well-known and established processes using only slightly adapted measures for producing the movement gaps, e.g. by a patterned application by screen printing techniques or by applying a photopatternable solder resist. For the photolithographic patterning, the resist application is exposed through a mask such that by the subsequent development not only the areas to be plated for the solder deposits but also the movement gaps according to the invention can be bared. The manufacture of the inventive solder resist coating is therefore advantageously simple and requires no additional process step compared to the processes already introduced.

Other features which are considered as characteristic for the invention are set forth in the appended claims.

Although the invention is illustrated and described herein as embodied in a solder resist coating for rigid-flex circuit boards and a method of producing the solder resist coating; it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The terms "top", "bottom", underside and upper side of the circuit board are used in the description of the embodiments of the invention in the manner in which they are reproduced in the figures. However, it will be clear to the person skilled in the art that these expressions can in some cases be used interchangeably.

Figure 1:
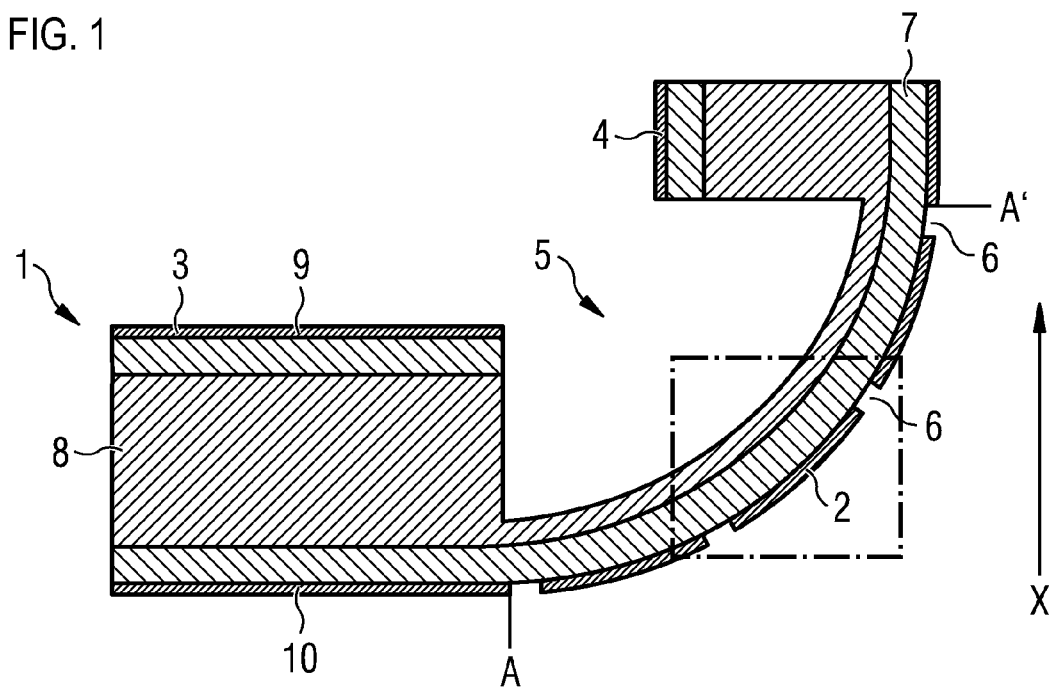
FIG. 1 is a diagrammatic, sectional view of a rigid-flex circuit board with a solder resist coating according to the invention.

Referring now to the figures of the drawing in detail and first, particularly, to FIG. 1 thereof, there is shown a sectional view of a rigid-flex circuit board with a solder resist coating 2 according to the invention. The rigid-flex circuit board 1 has a first rigid area 3 and a second rigid area 4. Disposed between the rigid areas 3, 4 is a flex area 5 in which the circuit board 1 is of a flexible configuration. In the flex area 5 extending over the length A-A' the circuit board 1 can be made of rigid circuit board material of lesser thickness. The flex area 5 can be produced, for example, as a recess in the circuit board 1 by depth milling. The solder resist coating 2 can inventively have one or more movement gaps 6. Disposed in the solder resist coating 2 shown are four movement gaps 6 which are oriented transversely, with particular preference perpendicularly, to the bending direction. The bending direction is indicated by the arrow X. In the embodiment shown, the solder resist coating 2 is stretched by the upward-directed flexure. However, it is also possible that the circuit board 1 may be bent the other way, i.e. downward, which means that the solder resist coating 2 may be compressed in the flex area 5. According to the invention it is advantageously possible, by use of the movement gaps 6 provided, to compensate both tensile stressing and compression of the solder resist coating 2 so that even when the circuit board 1 is flexed in different directions, peeling of the solder resist coating 2 can be delayed or prevented. The solder resist coating 2 is disposed on a conductor track layer 7 which is in turn disposed on a base material layer 8, e.g. a prepreg layer, for rigid circuit boards. The rigid-flex circuit board 1 can with equal preference also have a plurality of conductor track layers 7 and base material layers 8. The rigid-flex circuit board 1 can also have a plurality of flex areas 5, the recesses produced to provide the flex areas 5 for example being able to be disposed on the same or on different surface sides 9 and 10 of the circuit board 1. Accordingly, a solder resist coating 2 according to the invention with movement gaps 6 can likewise be provided on one or both surface sides 9, 10 of the rigid-flex circuit board 1. For example, according to the invention, the circuit board 1 with a printed circuit can be advantageously adapted in a particularly flexible manner to suit design circumstances and the spatial requirements.

Figure 2:
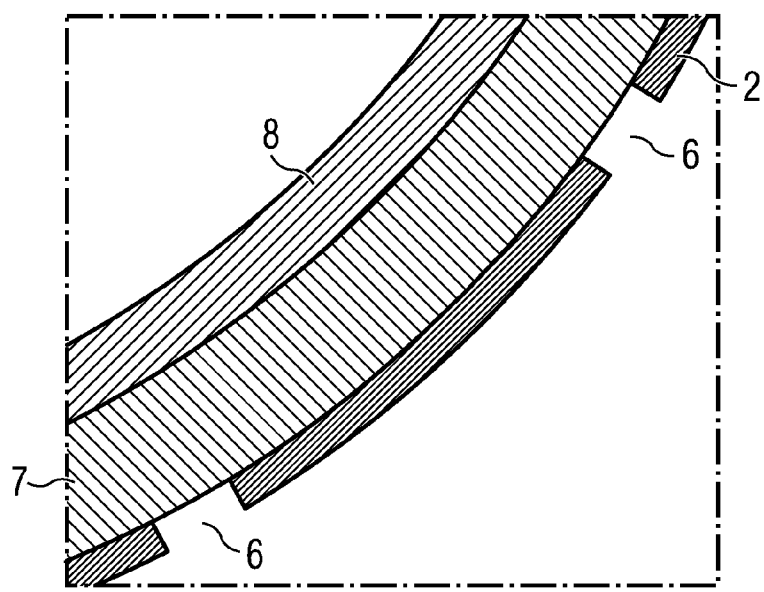
FIG. 2 is a diagrammatic, sectional view of a detail of a section from FIG. 1.

FIG. 2 shows a detail view of the section of the flex area 5 of the circuit board 1 from FIG. 1. On the base material layer 8 flexibly implemented in this area 5 by reducing the layer thickness, a conductor track layer 7 is applied underneath. On the underside of the circuit board 1, the protective solder resist coating 2 having two movement gaps 6 is disposed on the conductor track layer 7. By means of the inventively provided movement gaps 6, the flexure-induced stress in the solder resist coating 2 can be reduced while at the same time minimizing the short circuit risk.

Figure 3:
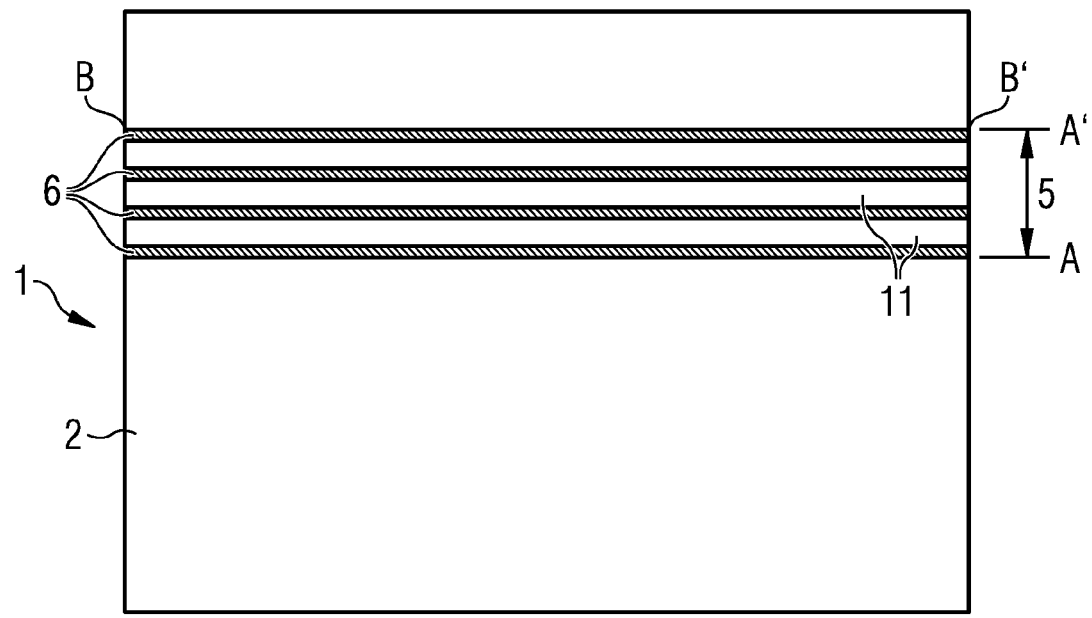
FIG. 3 is a diagrammatic, plan view of the circuit board having the solder resist coating according to the invention.

FIG. 3 shows a plan view of the circuit board 1 with the solder resist coating 2 according to the invention. In this embodiment, the solder resist coating 2 has in the flex area 5 (A-A') four movement gaps 6 which are implemented linearly in a straight line, the movement gaps 6 also being able to be disposed in parallel and equidistantly with respect to one another. They can also run transversely, in particular perpendicularly, to the bending direction, and extend over the entire width B-B' of the flex area 5. This advantageously enables the flexure-induced stresses to be well compensated. In this embodiment, the arrangement of the movement gaps 6 in the flex area 5 produces a striped pattern in the solder resist coating 2. The implementation of the movement gaps can be adapted in respect of different applications and associated requirements, such as the required degree of bending in the flex area 5. For example, the spacing of the movement gaps 6 can be tailored to the flexural loading. In addition, the ratio of the width of the movement gaps 6 to the width of the solder resist coating areas, in the embodiment shown the solder resist coating strips 11, can be varied, e.g. this ratio can preferably be 1:5. The solder resist coating strips 11 can then have, for example, a width of 1 mm and the movement gaps 6 a width of 0.2 mm, the width of the movement gaps 6 and solder resist coating strips 11 here referring to the dimension in the unflexed shape of the circuit board in the illustration shown. In adapting to a lower flexural loading, the width of the movement gaps 6 can be selected smaller in relation to the width of the solder resist coating strips 11. This ratio can then be 1:10, for example. Conversely, for higher bending stresses the ratio can be 1:3 or 1:2, so that the movement gap width increases in relation to the solder resist coating strip width. However, the invention is not limited to these specified values, but also encompasses any adjustment to the correspondingly occurring stresses.

By the inventively provided movement gaps 6, stresses occurring in the flex area 5 during flexure of the circuit board 1 are reduced and are not transmitted, or are transmitted only in a greatly reduced manner, to the rest of the coating structure through these interstices 6 in the solder resist coating 2, so that large-scale and undefined peeling of the solder resist coating 2 can advantageously be prevented to the largest possible extent. At the same time, good short circuit protection can also be inventively ensured.

Figure 4:
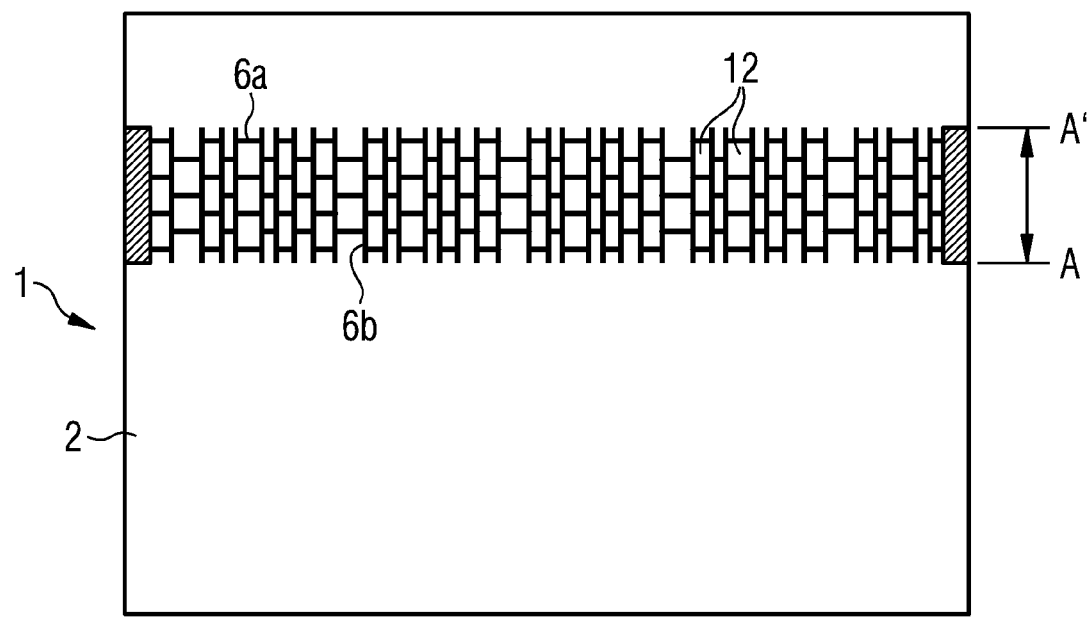
FIG. 4 is a diagrammatic, plan view of the circuit board having the solder resist coating according to the invention with transverse and longitudinal gaps.

FIG. 4 shows a plan view of the circuit board 1 with another preferred variant of the solder resist coating 2 according to the invention, with transverse gaps 6a and longitudinal gaps 6b, the transverse gaps 6a running transversely to the bending direction and the longitudinal gaps running in the bending direction. The transverse and longitudinal gaps 6a, 6b are disposed such that the solder resist coating 2 produces a block pattern in the flex area 5. In other words, the solder resist coating 2 can be subdivided into smaller solder resist blocks 12 by the transverse and longitudinal gaps. This advantageously enables locally occurring particularly high flexural stress to be prevented from causing large-scale and undefined peeling of the solder resist coating 2. The movement gaps 6 prevent the stresses from being transmitted beyond a solder resist block 12 into the rest of the protective layer 2 to other solder resist blocks 12. The solder resist blocks 12 can accordingly have the same or different dimensions and shapes. With particular preference, the solder resist blocks 12 can be disposed offset to one another by the arrangement of the transverse and longitudinal gaps 6a, 6b. This provides an even better means of compensating the mechanical loadings of the solder resist coating 2 by flexures of the circuit board 1. Moreover, it also enables short circuit protection to be increased still further.

Figure 5:
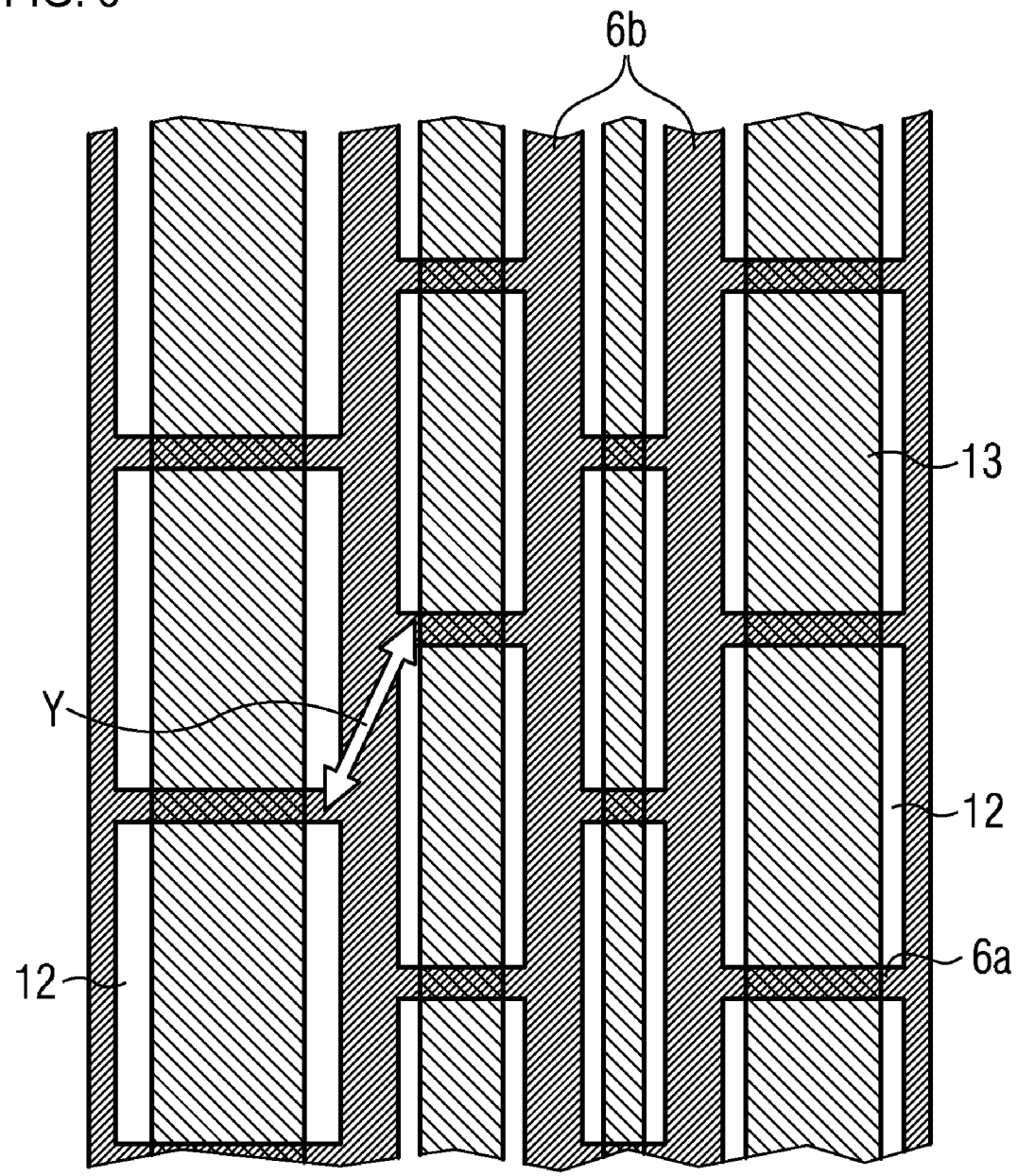
FIG. 5 is a diagrammatic, plan view of a section of the circuit board having the solder resist coating according to the invention with solder resist blocks disposed in an offset manner with respect to one another.

FIG. 5 shows a plan view of a section of the circuit board 1 in the flex area 5, having the solder resist coating 2 with solder resist blocks 12 disposed in an offset manner to one another. Here the solder resist blocks 12 are expediently disposed on conductor tracks 13. The solder resist blocks 12 are preferably wider than the conductor tracks 13 so as to provide maximum short circuit protection. The conductor tracks 13 are preferably oriented in the bending direction and are unprotected, i.e. without solder resist coat, only in the transverse gaps 6a. According to the invention, the solder resist blocks 12 can with particular preference be disposed such that the distance between the nearest transverse gaps 6a of two adjacent conductor tracks 13a and 13b is greater than the mutual spacing of the conductor tracks 13a and 13b. An example of this is indicated by the double-headed arrow Y. The advantage of this solution is that a short circuit between these adjacent conductor tracks 13a and 13b, e.g. caused by particles, is more unlikely, as the distance between the unprotected conductor track areas is maximized in the transverse gaps 6a. In other words the short circuit risk can be further reduced in this way.

The stresses occurring in the solder resist coating as the result of flexural stressing of the circuit board and the uncontrolled peeling of the coating as well as the electronic failures possibly resulting therefrom can advantageously be greatly reduced by the movement gaps 6 provided according to the invention. At the same time, the short circuit risk can be minimized or even virtually completely eliminated. As a result, the lifetime of an entire electronic module incorporating a circuit board with the solder resist coating according to the invention, e.g. an engine control unit, can also be significantly extended. The invention therefore also encompasses an electronic module containing the above described solder resist coating according to the invention in one of its various embodiments.

The features of the different preferred embodiments described can be implemented individually or in combination with one another as required.

To summarize, a solder resist coating for rigid-flex circuit boards is accordingly provided, enabling uncontrolled and undefined peeling of the solder resist under flexural loading to be significantly reduced or even prevented, while at the same time providing better short circuit protection. This advantageously significantly increases overall the useful life of a circuit board and the circuit printed thereon, and also extends the lifetime of an electronic module. In addition, the production of the inventively improved solder resist coating on a circuit board can be easily and inexpensively integrated into the overall assembly process of a circuit board and requires no additional process step compared to hitherto known methods. This means that already introduced methods such as screen printing or the photolithographic processing of a photopatternable solder resist coat can advantageously be used for which only slight adaptations are required for producing the movement gaps according to the invention in the solder resist coating, as the movement gaps can be produced in the same way and in the same step as the openings and lands for the solder deposits.

The invention claimed is:

1. A solder resist coating for a rigid-flex circuit board having at least one conductor track and at least one flex area, the solder resist coating comprising:
   a solder resist layer having at least one movement gap formed therein in an area of the flex area of the rigid-flex circuit board;
   wherein said at least one movement gap is one of a plurality of movement gaps running transversely to a bending direction; and
   wherein said solder resist layer has a plurality of longitudinal gaps formed therein running in the bending direction.

2. The solder resist coating according to claim 1, wherein said transverse gaps and said longitudinal gaps are disposed such that solder resist coating blocks are defined in said solder resist layer disposed in the flex area of the rigid-flex circuit board.

3. The solder resist coating according to claim 2, wherein said solder resist coating blocks are disposed offset to one another.

4. The solder resist coating according to claim 2, wherein said solder resist coating blocks are disposed on the conductor track.

5. The solder resist coating according to claim 2, wherein said solder resist coating blocks are made wider than the conductor track.

6. The solder resist coating according to claim 5, wherein the conductor track runs in the bending direction.

7. The solder resist coating according to claim 6, wherein:
   the rigid-flex circuit board has a plurality of conductor tracks; and
   said solder resist coating blocks are disposed such that a distance between said nearest transverse gaps of two adjacent conductor tracks is greater than a mutual spacing of the conductor tracks.

8. The solder resist coating according to claim 1, wherein said at least one movement gap is one of a plurality of movement gaps disposed linearly.

9. The solder resist coating according to claim 1, wherein said at least one movement gap is one of a plurality of movement gaps extending over an entire width of the flex area of the rigid-flex circuit board.

10. An electronic module, comprising:
    at least one rigid-flex circuit board having at least one conductor track, at least one flex area, and a solder resist coating, said solder resist coating having
    a solder resist layer having at least one movement gap formed therein in an area of the flex area of the rigid-flex circuit board;
    wherein said at least one movement gap is one of a plurality of movement gaps running transversely to a bending direction; and
    wherein said solder resist layer has a plurality of longitudinal gaps formed therein running in the bending direction.

* * * * *